(12) United States Patent
Percival (10) Patent No.: US 10,403,678 B2
(45) Date of Patent: *Sep. 3, 2019

(54) METHODS AND APPARATUS FOR IMPROVING MICRO-LED DEVICES (71) Applicant: Facebook Technologies, LLC, Menlo Park, CA (US)

(72) Inventor: Christopher Percival, Blarney (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/724,847

(22) Filed: Oct. 4, 2017

(65) Prior Publication Data
US 2018/0047782 A1    Feb. 15, 2018

Related U.S. Application Data (60) Division of application No. 15/284,369, filed on Oct. 3, 2016, now Pat. No. 9,812,494, which is a
(Continued)

(30) Foreign Application Priority Data

May 7, 2014    (GB) ..................... 1408084

(51) Int. Cl.
*H01L 29/15*    (2006.01)
*H01L 27/15*    (2006.01)
(Continued)

(52) U.S. Cl.
CPC ............ *H01L 27/156* (2013.01); *H01L 27/15* (2013.01); *H01L 31/036* (2013.01); *H01L 33/16* (2013.01);
(Continued)

(58) Field of Classification Search
None
See application file for complete search history.

(56) References Cited

U.S. PATENT DOCUMENTS 9,450,148 B2    9/2016  Shepherd
9,812,494 B2 *  11/2017 Percival ................ H01L 27/156
(Continued)

FOREIGN PATENT DOCUMENTS

EP    1 577 933 A2    9/2005
JP    H0923026 A      1/1997
(Continued)

OTHER PUBLICATIONS

Search Report for parent application United Kingdom Patent Application No. GB1408084.0, dated Oct. 1, 2014.
(Continued)

*Primary Examiner* — Nishath Yasmeen
(74) *Attorney, Agent, or Firm* — Fenwick & West LLP (57) ABSTRACT A μLED device comprising: a substrate and an epitaxial layer grown on the substrate and comprising a semiconductor material, wherein at least a portion of the substrate and the epitaxial layer define a mesa; an active layer within the mesa and configured, on application of an electrical current, to generate light for emission through a light emitting surface of the substrate opposite the mesa, wherein the crystal lattice structure of the substrate and the epitaxial layer is arranged such that a c-plane of the crystal lattice structure is misaligned with respect to the light emitting surface.

19 Claims, 6 Drawing Sheets

Related U.S. Application Data continuation of application No. 14/705,607, filed on May 6, 2015, now Pat. No. 9,502,595.

(51) Int. Cl.
  *H01L 33/24* (2010.01)
  *H01L 33/32* (2010.01)
  *H01L 31/036* (2006.01)
  *H01L 33/16* (2010.01)
  *H01L 33/20* (2010.01)
  *H01L 33/00* (2010.01)
  *H01L 33/26* (2010.01)

(52) U.S. Cl.
  CPC .............. *H01L 33/20* (2013.01); *H01L 33/24* (2013.01); *H01L 33/32* (2013.01); *H01L 33/0075* (2013.01); *H01L 33/26* (2013.01)

(56) References Cited

U.S. PATENT DOCUMENTS

| | | |
|---|---|---|
| 2003/0001238 A1 | 1/2003 | Ban |
| 2006/0113638 A1* | 6/2006 | Maaskant ......... H01L 31/03528 257/623 |
| 2008/0179610 A1 | 7/2008 | Okamoto et al. |
| 2009/0310640 A1 | 12/2009 | Sato et al. |
| 2010/0276663 A1 | 11/2010 | Enya et al. |
| 2011/0073838 A1 | 3/2011 | Khan et al. |
| 2011/0315998 A1 | 12/2011 | Hashimoto et al. |
| 2012/0007102 A1* | 1/2012 | Feezell ................ H01L 27/156 257/76 |
| 2012/0126283 A1 | 5/2012 | Zhao et al. |
| 2012/0313077 A1 | 12/2012 | Nakamura et al. |
| 2014/0353679 A1* | 12/2014 | Seo ..................... H01L 21/0237 257/76 |
| 2015/0179904 A1* | 6/2015 | Maaskant ............... H01L 33/20 257/98 |
| 2015/0236201 A1* | 8/2015 | Shepherd .......... H01L 31/02325 257/88 |

FOREIGN PATENT DOCUMENTS

| | | |
|---|---|---|
| JP | 2008-305971 A | 12/2008 |
| WO | WO2013/089417 | * 12/2012 |
| WO | WO2013/121051 | * 2/2013 |
| WO | WO 2014/032997 A1 | 3/2014 |

OTHER PUBLICATIONS

U.S. Office Action, U.S. Appl. No. 14/705,607, dated Mar. 1, 2016, 15 pages.

United States Office Action, U.S. Appl. No. 15/284,369, dated May 19, 2017, 20 pages.

* cited by examiner

METHODS AND APPARATUS FOR IMPROVING MICRO-LED DEVICES

CROSS-REFERENCE TO RELATED APPLICATIONS

This application is a divisional of U.S. patent application Ser. No. 15/284,369 filed on Oct. 3, 2016 which is a continuation of U.S. patent application Ser. No. 14/705,607 filed on May 6, 2015, now U.S. Pat. No. 9,502,595, which claims priority to United Kingdom Patent Application No. 1408084.0 filed May 7, 2014, each of which is hereby incorporated by reference in its entirety.

TECHNICAL FIELD

The invention relates to micro-LEDs (μLEDs). More specifically, the invention relates to methods and apparatus for guiding light emitted from μLEDs in order to improve or alter their performance.

BACKGROUND

LEDs convert electrical energy into optical energy. In semiconductor LEDs, light is usually generated through recombination of electrons, originating from an n-type doped semiconductor layer, and holes originating from a p-type doped semiconductor layer. In some infra-red emitting semiconductor materials light can be generated by electron intersub-band transitions rather than electron hole transitions. Herein, the area where the main light generation takes place is termed the light-emitting layer.

Further, the term "light" is used herein in the sense that it is used in optical systems to mean not just visible light, but also electromagnetic radiation having a wavelength outside that of the visible range.

A major challenge is to extract as much of the emitted light as possible from the semiconductor material into the surrounding medium, typically air, thereby increasing the extraction efficiency. This is hindered by total internal reflection at the surfaces of the semiconductor. This challenge is even greater in the field of μLEDs.

As used herein, the term "extraction efficiency" (EE) encompasses the amount of light extracted from an LED device as a proportion of the total light generated by the device. The EE may be expressed as a percentage. Further, the term "μLED" is used herein to encompass an LED that is smaller than a standard cuboid LED. A μLED may have an active region of approximately 10 μm or greater. Further, a μLED may comprise a mesa structure configured to direct light emitted from the active region to an emission surface in a quasi-collimated fashion.

A common approach to improve the EE of LEDs is to roughen the surfaces where the light exits the chip. This reduces the amount of light trapped by total internal reflection that occurs by randomising the angles at which the light hits the surface.

It is desirable to increase the EE of LEDs and μLEDs.

SUMMARY

Through experimentation, the inventors have discovered a problem with current LED and μLED devices. As set out herein, crystal structures within a device guide the light generated by the active region such that it reaches the emission surface at an angle greater than or equal to the total internal reflection angle. The inventors propose solutions generally to improve the EE of LEDs and μLED and, more specifically, to overcome the problem set out above.

According to one example, there is provided a μLED device comprising: a substrate and an epitaxial layer grown on the substrate and comprising a semiconductor material, wherein at least a portion of the substrate and the epitaxial layer define a mesa; an active layer within the mesa and configured, on application of an electrical current, to generate light for emission through a light emitting surface of the substrate opposite the mesa, wherein the crystal lattice structure of the substrate and the epitaxial layer is arranged such that a c-plane of the crystal lattice structure is misaligned with respect to the light emitting surface.

Optionally, the substrate and the epitaxial layer comprise a semiconductor material having a wurtzite crystal lattice structure.

Optionally, the semiconductor material comprises Gallium Nitride.

Optionally, the misalignment of the crystal lattice structure is sufficient that one or more 1122 planes of the crystal lattice structure is at an angle less than the angle of total internal reflection for the μLED device.

Optionally, the misalignment of the crystal lattice structure is such that one or more of the 1122 planes of the crystal lattice structure is at an angle in a range from 0 degrees to 30 degrees from a normal to the light emitting surface.

Optionally, the c-plane of the crystal lattice structure is misaligned from the light emitting surface such that the c-plane is at an angle less than the angle of total internal reflection for the μLED device.

Optionally, the c-plane of the crystal lattice structure is misaligned from the light emitting surface by an angle in a range from 85 degrees to 105 degrees.

According to another example, there is provided an array of μLED devices comprising one or more μLED devices as described above.

Optionally, a plurality of μLED devices in the array are individually addressable.

According to another example, there is provided a method for fabricating a μLED device comprising: forming a substrate; growing an epitaxial layer comprising a semiconductor material on the substrate; forming an active layer from a portion of the epitaxial layer; shaping at least a portion of the substrate and the epitaxial layer into a mesa, wherein the active layer is within the mesa, the active layer configured, on application of an electrical current, to generate light for emission through a light emitting surface of the substrate opposite the mesa, wherein the substrate and the epitaxial layer are arranged such that a c-plane of the crystal lattice structure is misaligned with respect to the light emitting surface.

BRIEF DESCRIPTION OF THE FIGURES

Exemplary embodiments are described herein with reference to the accompanying drawings, in which.

DESCRIPTION

Generally, disclosed herein are examples of µLEDs and methods of manufacture of µLEDs having off-axis crystal structures. The off-axis crystal structures serve to guide light generated at an active region of a µLED in directions advantageous to operation of the µLED in a given application. In specific arrangements, the off-axis crystal structures may be configured to direct light to be incident on an emission surface of the µLED at an angle less than the angle of total internal reflection.

Figure 1:
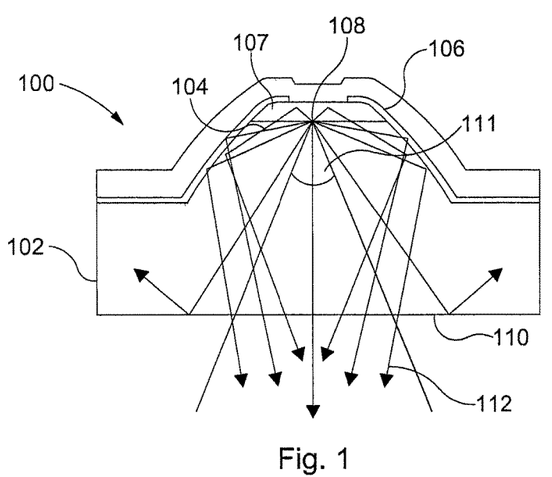
FIG. 1 is a schematic representation of a section through a μLED device.

FIG. 1 shows a schematic representation of a µLED 100 comprising a substrate 102 and an epitaxial layer 104. The substrate 102 and the epitaxial layer 104 may both comprise semiconductor material and may both be grown epitaxially using known techniques. The epitaxial layer 104 and at least part of the substrate 102 is shaped into a mesa structure 106. An active (or light emitting) layer 108 is enclosed in the mesa structure 106. The mesa 106 also comprises a further epitaxial layer 107 that is oppositely doped with respect to the first epitaxial layer 104. The active layer 108 is positioned between the oppositely doped semiconductor epitaxial layers 102, 107 and is configured to generate light when an appropriate electrical current is applied to the device 100. The mesa 106 has a truncated top, on a side opposed to a light transmitting or emitting surface 110 of the µLED 100. The light emitting surface 820 may be a surface of the substrate 102. The mesa 106 may also have a near-parabolic shape to form a reflective enclosure for light generated or detected within the device 100. The arrows 112 show how light emitted from the active layer 108 is reflected off the walls of the mesa 106 toward the light emitting surface 110. The light emitting surface 110 is polished, which creates an angle of total internal reflection 111 about a normal to the light emitting surface 110. Light incident on the light emitting surface 110 at an angle less than the angle of total internal reflection is emitted from the emitting surface 110. Light incident on the light emitting surface 110 at an angle greater than the angle of total internal reflection is not emitted from the emitting surface 110 but is reflected back into the device 100.

The reflection of the light from the internal surfaces of the mesa 106 results in light being emitted from µLED 100 in a quasi-collimated fashion. The term "quasi-collimated" is used herein to define the light confined within the critical escape angle of an LED device, e.g. with an angle to a normal less than the angle of total internal reflection. Light generated in the active layer must exit either: (a) directly through an exit face without reflection on the mesa sidewall; (b) via a single reflection on the mesa sidewall resulting in an incident angle to the exit face within the critical angle range; or (c) following multiple reflections within the mesa structure. Quasi-collimated light has an emission angle lying between the collimated light emitted by a laser and the uncollimated light emitted by an LED.

Figure 2A:
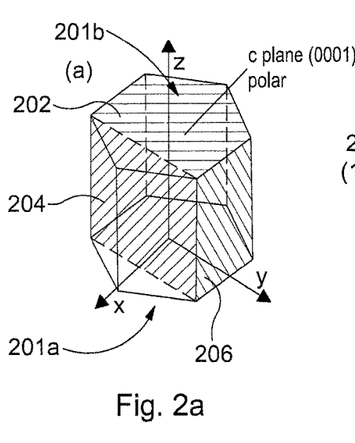
FIGS. 2a-c show schematic representations of a wurtzite crystal structure and the a-plane, c-plane, m-plane and semi-polar plane.
Figure 2B:
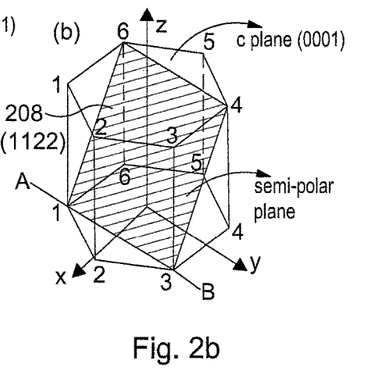

A particular exemplary µLED has a wurtzite crystal semiconductor substrate and may also have a wurtzite crystal semiconductor epitaxial layer. In such devices, the individual crystals grown epitaxially form hexagonal tubes or cylinders, as shown in FIGS. 2a and 2b. The exemplary crystals lattice structures shown in FIGS. 2a and 2b relate to the crystal lattice structure of Gallium Nitride (GaN).

In FIGS. 2a and 2b, the crystal lattice structures are represented by a hexagonal tube 200, which may be referred to as the unit cell. The term unit cell encompasses the smallest collection of molecules that contains atoms at the vertices of all low index planes of a crystal lattice. The gallium and nitrogen atoms are shown in FIG. 2. The molecule is tetrahedral and comprises four equalateral triangles, which in wurtzite is arranged to pruduce a hexagonal/cubic symmetry.

Figure 3:
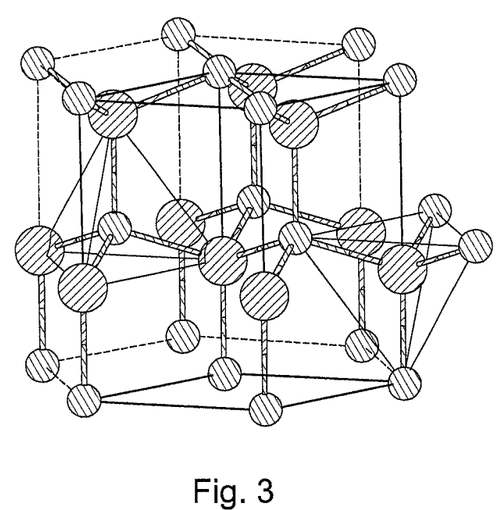
FIG. 3 shows a schematic representation of a wurtzite crystal lattice structure.

Each vertex of each hexagonal ends 201a, 201b of the unit cell 200 corresponds to the position of an atom in the GaN material. Therefore, the two ends 201a, 201b represent adjacent groups of atoms forming a hexagon in the hexagonal crystal lattice structure of GaN. It is noted that the ends 201a, 201b are shown as ends in FIGS. 2a and 2b for explanatory purposes only. In reality, there may be many more than two adjacent hexagonally positioned groups of atoms forming a hexagonal tube. A more accurate representation of a GaN wurtzite structure is shown in FIG. 3.

A number of planes of a crystal lattice structure may be defined as connecting a plurality of atoms within the structure. FIG. 2a shows a polar c-plane 202, a non-polar a-plane 204 and a non-polar m-plane 206. The c-plane 202 is coincident with the plane of the end faces 201a, 201b of the unit cell 200 and is at right angles to longitudinal axis of the unit cell 200. The a-plane 204 is coincident with a plane cutting the unit cell 200 between alternate vertices of the hexagonal end faces 201a, 201b of the unit cell 200. That is, the a-plane 204 is coincident with a plane that forms a triangle with two outer faces of the hexagonal end faces 201a, 201b of the unit cell 200. The m-plane 206 is orthogonal to the a-plane 204 and the c-plane 202 and is coincident with an outer longitudinal surface of the hexagonal tube 200.

FIG. 2b shows a higher index, semi-polar plane 208. The semi-polar plane 208 may be referred to as the "1122" plane. Further, the family of semi-polar planes 208 described below may be defined as the "{1122}" planes. Higher index planes are defined between atoms or molecules of the lattice structure that do not correspond longitudinally. That is, the higher order planes run diagonally and longitudinally through the lattice structure.

The higher index, semi-polar plane 208 is coincident with a plane running diagonally and longitudinally through the unit cell 200. If the vertices of the hexagonal ends of the unit cell 200 where numbered clockwise from 1-6, as in FIG. 2b, the semi-polar plane would run through vertices 1 and 3 of a first end (shown by A-B in FIG. 2b) and through vertices 4 and 6 of a second end. The semi-polar plane 208 forms an angle of approximately 32 degrees with the c-plane. It should be noted that there are further higher index planes, which are at the same angle to the c-plane as the semi-polar plane 208. Such higher index planes may pass through points 2 and 4 of the first end 201a and points 1 and 5 of the second end 201b, points 3 and 5 of the first end 201a and points 2 and 6 of the second end 201b, points 4 and 6 of the first end 201a and points 3 and 1 of the second end 201b, points 5 and 1 of the first end 201a and points 4 and 2 of the second end 201b and points 6 and 2 of the first end points 5 and 3 of the second end 201b. These semi-polar high order planes are not shown in FIG. 2b.

Figure 2C:
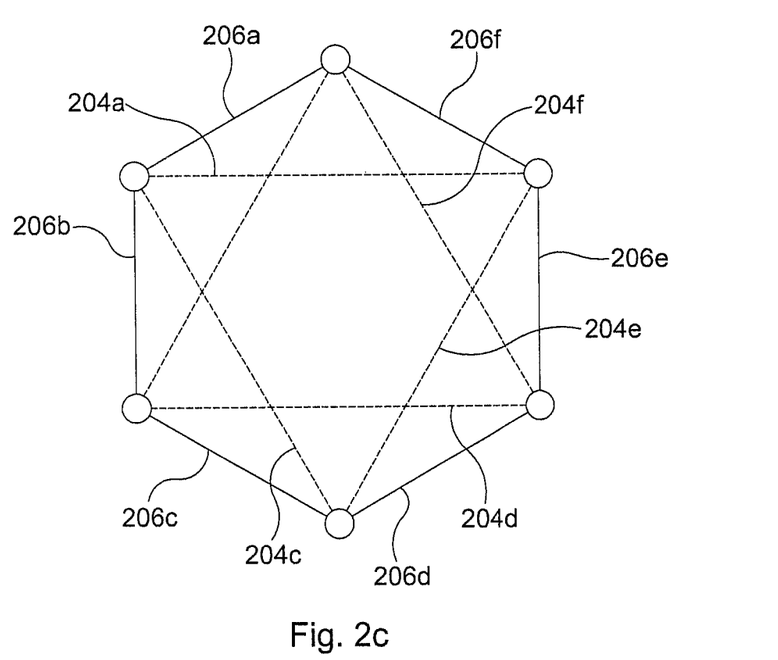

FIG. 2c shows schematically the a-planes 204a-f and m-planes 206a-f of a wurtzite crystal structure when looking down on the c-plane 202. It can be seen that a hexagon is formed by the a-planes 204a-f. This hexagon is also defined at the c-plane by the semi-polar planes 208.

Figure 4:
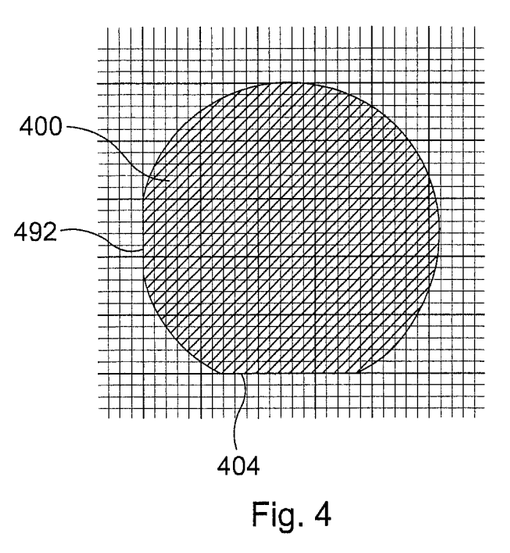
FIG. 4 shows a schematic representation of a semiconductor wafer.

FIG. 4 shows an outline of a semiconductor wafer 400 on cm squared graph paper. Typically, μLED devices are grown on the semiconductor wafer 400 having a minor flat 402 coincident with the m-plane 206 of the crystal lattice structure and a major flat 404 coincident with the a-plane 204 of the crystal lattice structure. Consequently, when the substrate 102 and epitaxial layer 104 of a μLED device are grown epitaxially, the hexagonal tubes 200 are aligned vertically on the wafer 400. That is, the c-plane 202 is parallel with the surface of the wafer 400 and, in a finished device, with the light emitting surface 110. This produces a honeycomb pattern when the crystal lattices are tessellated. In view of this, the a-plane 204 and m-plane 206 of each crystal lattice run vertically through the substrate 102 and epitaxial layer 104, substantially parallel to a normal to the light emitting surface 110.

Through experimentation, the inventors have identified a problem with μLED devices having a crystal lattice structure longitudinally aligned with a normal to the emission surface 110 of the device. That is, the inventors have identified a problem with μLED devices in which the c-plane of the crystal lattice structure is parallel to an emission surface of the device.

Figure 5:
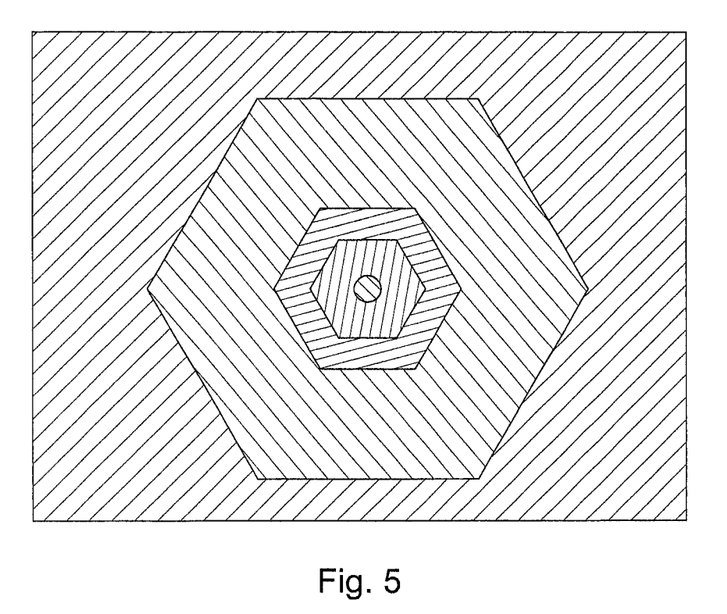
FIG. 5 shows an image of light seen at an unpolished light emitting surface of a μLED device.
Figure 6:
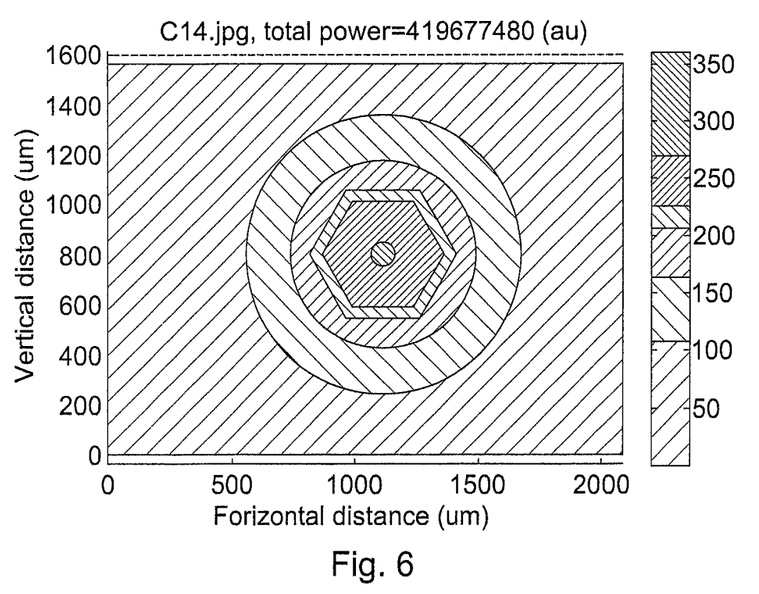
FIG. 6 shows an intensity surface contour plot of the light shown in FIG. 5.

Using a device 100 with an unpolished light emitting surface 110, the inventors have observed a phenomenon that reduces the EE of μLED devices. The phenomenon is shown in FIGS. 5 and 6. FIG. 5 shows an image of light seen at an unpolished light emitting surface 110 of a μLED device. FIG. 6 shows an intensity surface contour plot of the light shown in FIG. 5.

The light in FIG. 5 has a wavelength of 405 nm and is emitted from a GaN μLED device having a wurtzite hexagonal crystal lattice structure. However, it is noted that a similar phenomenon has been observed on similarly constructed devices having different wavelengths of emitted light. The light in FIG. 5 can be seen to define a distinct hexagonal emission pattern and has been observed at an unpolished light emitting surface 110. This hexagonal pattern may be seen more clearly in FIG. 6. The centre-to-edge distance of the hexagonal light emitted is consistent with the scale of the thickness of a combination of the epitaxial layer 104 and the substrate 102. That is, the centre to edge distance of each hexagon seen at the unpolished light emitting surface 110 corresponds to an angle of 32 degrees inside the epitaxial layer 104 and the substrate 102. Specifically, a right angled triangle can be formed from the thickness of the epitaxial layer 104 and substrate 102 combined, the centre to edge distance of the emitted hexagonal light and the angle at which the light is guided through the epitaxial layer 104 and substrate 102. Therefore, based on the thickness of the epitaxial layer 104 and substrate 102 and the centre to edge distance of the emitted hexagonal light, and angle of approximately 32 degrees is calculated and defines the hexagon emission at the surface. It is the calculation of 32 degrees that leads to the conclusion that light is being guided through the crystal lattice structure along the semi polar plane 208.

Figure 7:
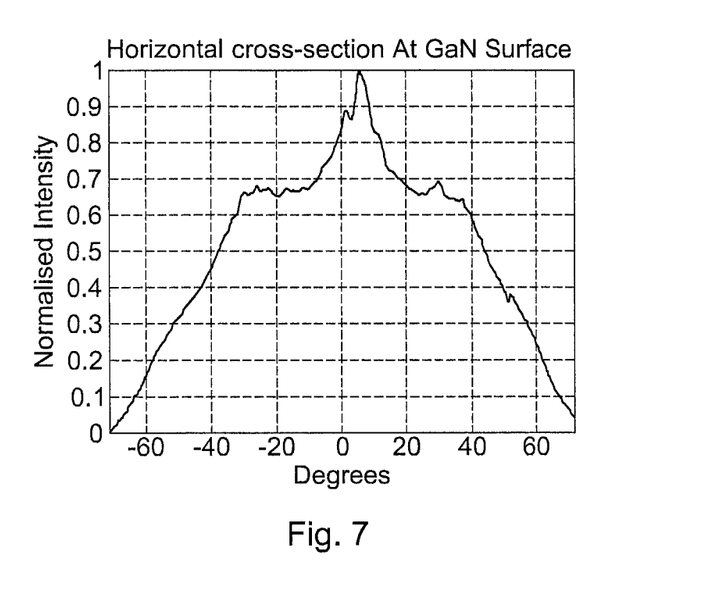
FIG. 7 shows a slice through the centre of the intensity data of FIG. 5.

The linear horizontal distance shown in FIG. 6, may be converted to a propogation angle inside the substrate and normal to the light emitting surface 110 by:

$$\tan\theta = \frac{w}{h}$$

Where θ is the angle of the light propogating inside the substrate to the normal of the light emitting surface 110, w is the linear horizontal distance and h is the distance from the active layer 108 to the light emitting surface 110. Given an exemplary wafer thickness of 350 μm and assuming an exemplary 20 μm diameter μLED can be approximated as a point source, the resulting plot of angle of emission against light intensity can be seen in FIG. 7, which shows a slice through the centre of the intensity data of FIG. 5 with the horizontal distance scale converted from μm to an angle in degrees using the measured wafer parameters and the equation above. FIG. 7 shows a bright central peak, falling to 'shoulders' corresponding to the edges of the hexagonal light pattern at approx 30 degrees from the peak.

The hexagonal pattern has been observed to rotate with the epitaxial layer and is not considered to be an optical effect of the lenses used to image the light emitting surface. Near field observation of the source also does not indicate any hexagonal structure. The inventors have concluded that the observed pattern of the intermediate radiant field in the crystal is a previously unobserved property of the wurtzite crystal caused by emitted light being guided along the semi-polar plane 208, defined above.

The polar c-plane 202 and the semi-polar plane 208 have lower symmetry and their electronic and optical properties are direction dependent due to this asymmetry and anisotropic strain components causing electron-hole polarization. The refractive index in the c-plane 202 and the semi-polar plane 208 are also affected and photons travelling in or near these planes will be index-guided in much the same way as light is index guided in an optical fibre.

The inventors have identified that this effect is causing the hexagonal light pattern at the unpolished light emitting surface 110 of the μLED device. This is because the hexagonal light pattern is observed at an angle of approximately 32 degrees, which corresponds to the angle of the semi-polar plane 208 to a normal to the c-plane 202 identified in FIG. 2b. In typical devices, the c-plane 202 is coincident with the light emitting surface 110, so the angle of 32 degrees is also with respect to a normal to the light emitting surface 110. The other planes in the direction of propogation (a and m) are non-polar and therefore not likely to contribute to index guiding.

In exemplary μLED devices 100, the refractive index of the substrate 104 may be approximately 2.5. In such devices, when the light emitting surface 110 is polished, the resulting angle of total internal reflection is approximately 23.5 degrees. The hexagonal light pattern shown in FIGS. 5 and 6 is emitted at an angle lying outside the angle of total internal reflection and is therefore internally scattered and not normally observed. This internal scattering represents a significant radiant emission loss mechanism for any μLED structure, reducing the EE, impacting directly both external quantum efficiency and total radiant power. Also in addressable μLED device arrays it would increase cross-talk between μLED devices in the array, as the internally scattered light would re-scatter from any feature it subsequently encountered and contribute to noise in adjacent μLED devices.

The capture of this emission via the control or suppression of this effect will therefore increase EE per pixel and reduce addressable device cross-talk. Also utilising the effect could yield novel devices as yet unknown.

Figure 8:
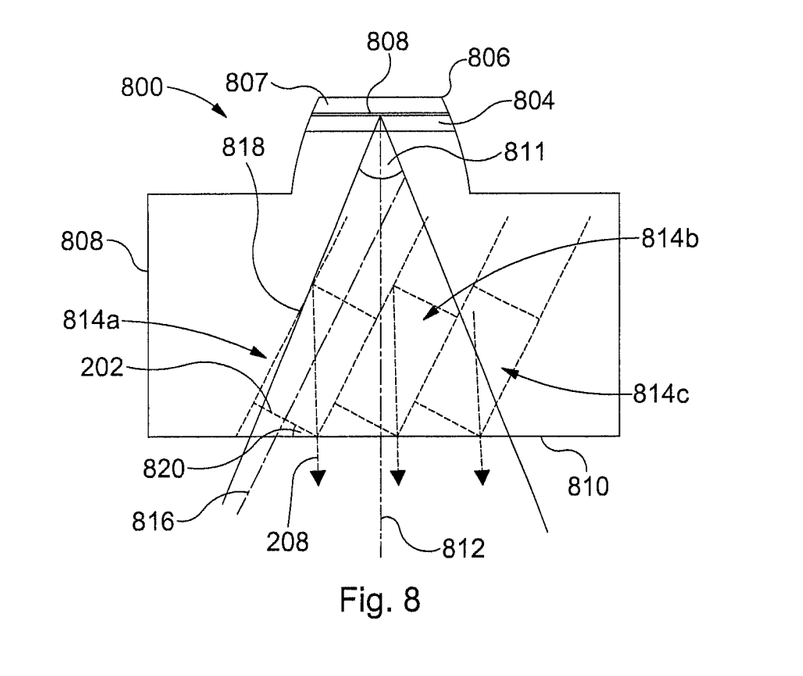
FIG. 8 shows a schematic representation of a section through a µLED device.

FIG. 8 shows a schematic representation of an exemplary μLED device 800 that is not drawn to scale. The device 800 comprises a substrate 802 and an epitaxial layer 804, grown on the substrate and a mesa 806 formed at least partly from the substrate 802 and the epitaxial layer 804. The substrate 802 is typically one or two orders of magnitude thicker than the epitaxial layer 804. Typically, the thickness of the epitaxial layer 804 is in a range from 1-5 µm and the substrate is in the order of a few hundred µm. An active layer 808 is within the mesa 806 and is configured to generate light on application of a given electrical bias. Light generated from the active layer 808 is emitted from the µLED device 800 through a light emitting surface 810, as described above in relation to FIG. 1. The light emitting surface 810 may be polished and, therefore, only light incident on the light emitting surface 810 within a given angle 811 to a normal 812 to the light emitting surface 810 is emitted. The given angle 811 may be termed the angle of total internal reflection. Light incident on the light emitting surface 810 at an angle greater than the angle of total internal reflection is reflected back off the light emitting surface 810 into the µLED device 800. Insulation and metallisation layers are not shown in FIG. 8, although they may be added to practical implementations of the µLED 800.

The substrate 802 of the µLED device 800 comprises a crystal lattice structure. In the exemplary µLED device 800, the crystal lattice structure is a wurtzite structure and the epitaxial layer 804 comprises GaN. The substrate 802 has been formed such that a longitudinal axis of the crystal lattice structures is misaligned with respect to a normal 812 to the light emitting surface 810. In exemplary µLED devices, the substrate 802 has been grown such that the c-plane 202 of the crystal lattice structures is similarly misaligned with respect to the light emitting surface 810. The epitaxial layer 804 is grown on top of the substrate 802 and so the crystal lattice structure of the epitaxial layer 804 has the same orientation as the crystal lattice structure of the substrate 802.

FIG. 8 shows schematically an exemplary misalignment of the crystal structure of the wurtzite crystal lattices 814a-c that make up the substrate 802. It is noted that the wurtzite crystal lattices 814a-c are shown schematically only for the purpose of easier explanation and need not be considered to scale. In addition, the exemplary misalignment of the crystal lattice structure is for explanatory purposes and is not necessarily indicative of the misalignments used in the invention.

Considering an exemplary crystal lattice 814a, a longitudinal axis 816 runs along the length of the lattice 814a. The c-plane 202 of the crystal lattice 814a is perpendicular to the longitudinal axis 816. A longitudinal side 818 of the crystal lattice 814a is perpendicular to the longitudinal axis 816 and may be coincident with either of the a-plane 204 or the m plane 206 (not shown in FIG. 8). The semi-polar plane 208 of the crystal lattice 814a is also shown in FIG. 8. The semi-polar plane 208 is a plane of the crystal lattice 814a that is at an angle to the longitudinal axis 816 in a range of 30 degrees to 35 degrees, more specifically, approximately 32 degrees.

The c-plane 202 of the crystal lattice 814a is misaligned with respect to the light emitting surface 810 in that it is not parallel thereto. The c-plane 202 is at an angle 820 with respect to the light emitting surface 810. It can also be seen that the longitudinal axis 816 of the crystal lattice 814a is at an angle to the normal 812 that is equal to the angle 820. In exemplary µLED devices, the angle 820 may be sufficient to ensure that the semi-polar plane 208 lies at an angle to the normal 812 that is less than the angle of total internal reflection 811. This can be seen in FIG. 8, as the arrow representing the semi-polar plane 208 is within the angle of total internal reflection 811. In further exemplary µLED devices, the angle 820 may be in a range from 2 degrees to 50 degrees, in a range from 5 degrees and 50 degrees or in a range from 5 degrees to 10 degrees. In further exemplary µLED devices, the semi-polar plane 208 may be at an angle to the normal 812 in a range from 0 degrees to 30 degrees.

By aligning the semi-polar plane 208 such that it is within the angle of total internal reflection, the µLED device is able to solve or mitigate one or more of the problems disclosed herein. Specifically, light generated by the active layer 808 and guided by the semi-polar plane 208 is incident on the light emitting surface 810 of the µLED device 800 at an angle less than or equal to the angle of total internal reflection 811.

In yet further exemplary µLED devices, the crystal lattice structure of the substrate 802 and epitaxial layer 804 may be configured such that light emitted from the active layer 808 is guided by the c-plane 202 such that it is incident on the light emitting surface 810 at an angle less than the angle of total internal reflection. In exemplary devices, the c-plane 202 may be in a range from 0 degrees to 30 degrees to the normal 812 to the light emitting surface 810. In a specific device, the c-plane 202 may be substantially coincident with the normal 812.

A method of fabricating an example of a µLED device 800 is described with reference to FIG. 9. A semiconductor substrate 802 is grown 900 such that the c-plane 202 of the crystal lattice structure of the semiconductor material is misaligned with respect to the light emitting surface 810 of the µLED device 800, as described above.

First and second epitaxial layers 804, 807 are grown 902. The first epitaxial layer 804 is epitaxially grown on the substrate 802 and the further epitaxial layer 807, oppositely doped, is grown on the first epitaxial layer 804.

An active layer 808 is formed 904 between the first and further epitaxial layers 804, 807. The active layer 808 is configured to generate light when an electrical current is applied to the device and/or to generate an electrical current when light is incident on the active layer 808.

A surface of the further epitaxial layer 807 is shaped 904 to form a mesa 806 comprising at least part of the further epitaxial layer 807, at least part of the active layer 808 and at least part of the first epitaxial layer 804. This may be done by etching and methods suitable are set out in WO 2004/097947.

Figure 9:
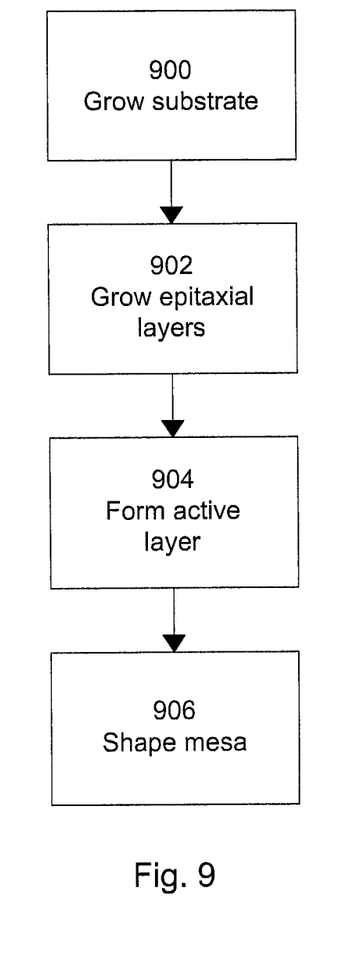
FIG. 9 shows a flow diagram of a method of manufacture of a µLED device.

For clarity, many of the steps required to manufacture a complete µLED device are not shown in FIG. 9, although these will be known to the skilled person. Similarly, many further features will be required in FIG. 8 to make the device 800 operational, but these are not shown, for clarity purposes.

Whilst specific embodiments are described herein, it will be appreciated that a number of modifications and alterations may be made thereto without departing from the scope of the disclosure, as set out in the appended claims.

What is claimed is:

1. A method for fabricating a light emitting diode (LED) device comprising:
   forming a substrate including a light emitting surface, a portion of the substrate protruding in a direction away from the light emitting surface;
   forming an epitaxial layer over the portion of the substrate that protrudes in the direction away from the light emitting surface; and
   forming an active layer on the epitaxial layer, the active layer generating light that is emitted through the light emitting surface of the substrate responsive to an application of an electrical current to the active layer, wherein the protruded portion of the substrate, the formed epitaxial layer, and the formed active layer form a truncated parabolic mesa;

wherein at least one of the substrate and the epitaxial layer is formed to comprise a crystal lattice structure with one or more 1122 planes of the crystal lattice structure at an angle from a normal to the light emitting surface that is less than an angle of total internal reflection for the LED device; and wherein the angle of the total internal reflection is determined by a material of the substrate and the crystal lattice structure.

2. The method of claim 1, further comprising:
forming a c-plane of the crystal lattice structure to be non-parallel to the light emitting surface of the substrate.

3. The method of claim 1, wherein forming the substrate comprises:
forming the substrate to include another surface at an opposite side of the light emitting surface, and wherein the portion of the substrate is formed to protrude from a portion of the other surface of the substrate.

4. The method of claim 1, wherein the crystal lattice structure is formed to comprise a wurzite crystal lattice structure.

5. The method of claim 1, wherein forming the substrate and forming the epitaxial layer comprises forming the substrate and forming the first epitaxial layer using a semiconductor material.

6. The method of claim 5, wherein the semiconductor material used to form the substrate and the epitaxial layer comprises Gallium Nitride.

7. The method of claim 1, wherein the angle of the one or more 1122 planes of the crystal lattice structure is formed to be in a range from 0 degrees to 30 degrees from the normal to the light emitting surface of the substrate.

8. The method of claim 2, wherein forming the c-plane comprises:
forming the c-plane at an angle that is less than the angle of total internal reflection of the LED device.

9. The method of claim 2, wherein forming the c-plane comprises:
forming the c-plane of the crystal lattice structure to be non-parallel to the light emitting surface by an angle in a range from 85 degrees to 105 degrees.

10. The method of claim 1, further comprising:
forming a another epitaxial layer over the active layer, the other epitaxial layer oppositely doped from the epitaxial layer.

11. The method of claim 1, further comprising:
polishing the light emitting surface of the substrate.

12. A method for fabricating an array of a plurality of light emitting diode (LED) devices, the method comprising:
forming, for each of the plurality of LED devices, a substrate including a light emitting surface, a portion of the substrate protruding in a direction away from the light emitting surface;
forming, for each of the plurality of LED devices, an epitaxial layer over the portion of the substrate that protrudes in the direction away from the light emitting surface; and
forming, for each of the plurality of LED devices, an active layer over the epitaxial layer, the active layer generating light that is emitted through the light emitting surface of the substrate responsive to an application of an electrical current to the active layer, wherein the protruded portion of the substrate, the formed epitaxial layer, and the formed active layer of the at least one of the plurality of LED devices form a truncated parabolic mesa;

wherein at least one of the substrate and the epitaxial layer of the plurality of LED devices is formed to comprise a crystal lattice structure with one or more 1122 planes of the crystal lattice structure at an angle from a normal to the light emitting surface that is less than an angle of total internal reflection of the plurality of LED devices; and wherein the angle of the total internal reflection for each of the plurality of LED devices is determined by a material of the substrate and the crystal lattice structure of the LED device.

13. The method of claim 12, further comprising:
forming, for each of the plurality of LED devices, a c-plane of the crystal lattice structure to be non-parallel to the light emitting surface of the substrate.

14. The method of claim 12, wherein forming the substrate comprises:
forming the substrate to include another surface at an opposite side of the light emitting surface, and wherein the portion of the substrate is formed to protrude from a portion of the other surface of the substrate.

15. The method of claim 12, wherein the crystal lattice structure is formed to comprise a wurzite crystal lattice structure.

16. The method of claim 12, wherein forming the substrate and forming the epitaxial layer comprises forming the substrate and forming the epitaxial layer using a semiconductor material.

17. The method of claim 16, wherein the semiconductor material used to form the substrate and the first epitaxial layer comprises Gallium Nitride.

18. The method of claim 12, wherein the angle of the one or more 1122 planes of the crystal lattice structure is formed to be in a range from 0 degrees to 30 degrees from the normal to the light emitting surface of the substrate.

19. A light emitting diode (LED) device created by a process comprising:
forming a substrate including a light emitting surface, a portion of the substrate protruding in a direction away from the light emitting surface;
forming an epitaxial layer over the portion of the substrate that protrudes in the direction away from the light emitting surface; and
forming an active layer on the epitaxial layer, the active layer generating light that is emitted through the light emitting surface of the substrate responsive to an application of an electrical current to the active layer, wherein the protruded portion of the substrate, the formed epitaxial layer, and the formed active layer form a truncated parabolic mesa;

wherein at least one of the substrate and the epitaxial layer is formed to comprise a crystal lattice structure with one or more 1122 planes of the crystal lattice structure at an angle from a normal to the light emitting surface that is less than an angle of total internal reflection for the LED device; and wherein the angle of the total internal reflection is determined by a material of the substrate and the crystal lattice structure.

* * * * *

UNITED STATES PATENT AND TRADEMARK OFFICE
CERTIFICATE OF CORRECTION

PATENT NO. : 10,403,678 B2
APPLICATION NO. : 15/724847
DATED : September 3, 2019
INVENTOR(S) : Percival It is certified that error appears in the above-identified patent and that said Letters Patent is hereby corrected as shown below:

In the Claims

In Column 9, Claim 4, Line 24, delete "wurzite" and insert -- wurtzite --, therefor.

In Column 10, Claim 15, Line 28, delete "wurzite" and insert -- wurtzite --, therefor.

Signed and Sealed this
Third Day of March, 2020

Andrei Iancu
*Director of the United States Patent and Trademark Office*